United States Patent [19]

Hosticka et al.

[11] Patent Number: 4,843,341
[45] Date of Patent: Jun. 27, 1989

[54] DIFFERENTIAL AMPLIFIER HAVING CONTROLLABLE POWER CONSUMPTION

[75] Inventors: Bedrich J. Hosticka, Duisburg; Roland Klinke, Dortmund; Hans-Joerg Pfleiderer, Zorneding, all of Fed. Rep. of Germany

[73] Assignee: Siemens Aktiengesellschaft, Berlin and Munich, Fed. Rep. of Germany

[21] Appl. No.: 137,606

[22] Filed: Dec. 24, 1987

[30] Foreign Application Priority Data

Jan. 22, 1987 [DE] Fed. Rep. of Germany ....... 3701791

[51] Int. Cl.[4] .............................................. H03F 3/45
[52] U.S. Cl. .................................... 330/253; 330/261
[58] Field of Search ................................ 330/253, 261

[56] References Cited

U.S. PATENT DOCUMENTS 4,728,900 3/1988 Nakagawara et al. .............. 330/253

OTHER PUBLICATIONS

"Design of MOS VLSI Circuits for Telecommunications" by Tsividis et al., Prentice-Hall, Inc., pp. 129–136.

Primary Examiner—James B. Mullins

[57] ABSTRACT

The differential amplifier has two n-channel or p-channel field effect transistors serving as controllable current sources which supply auxiliary currents upon appearance of an input signal which amplify the quiescent current. The inputs of the differential amplifier are connected to the gate terminals of the n-channel or p-channel field effect transistors via a level-converting circuit for converting the d.c. component of the input signal superimposed on a gate bias voltage to a lower or, respectively, higher output level. As a result of the control of the current sources proceeding from the amplifier input good driver qualities, a distortion-free signal transmission and a lower dissipation power are guaranteed.

14 Claims, 3 Drawing Sheets

DIFFERENTIAL AMPLIFIER HAVING CONTROLLABLE POWER CONSUMPTION

BACKGROUND OF THE INVENTION

The invention as directed to a differential amplifier having controllable power sources.

A differential amplifier of this type is described in the book "Design of MOS VLSI Circuits for Telecommunications" by Y. Tsividis and P. Antognetti, Prentice Hall, N.J. (1985), pages 129 through 136, C.F. particulary FIG. 5.4. Two field effect transistors connected parallel to a power source and serving as controllable power sources are thereby influenced via current-mirror circuits by currents flowing in parallel voltage arms. When a fixed voltage value is exceeded by an input signal superimposed on a gate bias, one field effect transistor supplies an auxiliary current intensifying the quiescent current of the current source. The current-mirroring circuits are fashioned such that the low quiescent current is greatly boosted by the signal-dependent appearance of the auxiliary currents. Good driver properties given a simultaneous reduction of the dissipated power of the differential amplifier are thus achieved.

A disadvantage of this known amplifier, however, is that instabilities which often lead to a distortion of the output signal occur in the control circuits. Then control circuits are formed of parallel circuit branches, of current-mirroring circuits, of controllable current sources and of a further circuit branch. This instability particularly occurs when an input signal has steeply rising and decaying signal edges, for example a square-wave voltage.

SUMMARY OF THE INVENTION

The object of the present invention is to provide a differential amplifier of the species initially cited which has good driver properties without having to accept the afore- mentioned disadvantage. This is achieved by fashioning the differential amplifier in accordance with the present invention.

The advantage obtainable with the invention is good driver properties, a high quality of the signal transmission and a low dissipated power.

The differential amplifier has two n-channel or p-channel field effect transistors serving as controllable current sources which supply auxiliary currents upon appearance of an input signal which amplify the quiescent current. The inputs of the differential amplifier are connected to the gate terminals of the n-channel or p-channel field effect transistors via a level-converting circuit for converting the d.c. component of the input signal superimposed on a gate bias voltage to a lower or, respectively, higher output level. As a result of the control of the current sources proceeding from the amplifier input, good driver qualities, a distortion-free signal transmission and a lower dissipation power are guaranteed.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several figures of which like reference numerals identify like elements, and in which:

DESCRIPTION OF THE PREFERRED EMBODIMENT

Figure 1:
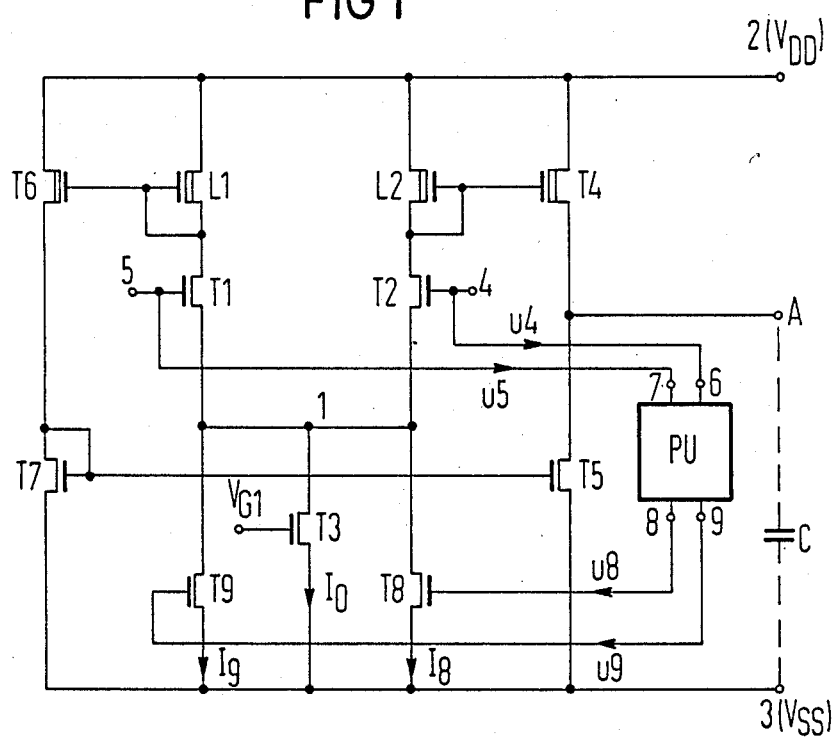
FIG. 1, is a fundamental circuit diagram of a differential amplifier of the present invention.

In FIG. 1, a circuit node 1 of the differential amplifier is connected to a terminal 2, that is wired to a supply voltage $V_{DD}$, via two parallel circuit branches of which one contains a series circuit of a load element L1 and an n-channel field effect transistor T1 and of which the other contains the series circuit of a load element L2 and an n-channel field effect transistor T2. The circuit node 1 is also connected to a terminal 3, lying at reference potential $V_{SS}$, via a further circuit branch which contains an n-channel field effect transistor T3 connected as a constant current source. The gate of T3 is thereby wired to a fixed gate voltage $V_{G1}$. The load elements L1 and L2 are each composed of a p-channel field effect transistor whose drain terminal is connected to its gate terminal. The series circuit of a p-channel field effect transistor T4 and an n-channel field effect transistor T5 lies between the terminals 2 and 3, whereby the gate of T4 is connected to the gate of the field effect transistor forming the load element L2. A further circuit branch connecting the terminals 2 and 3 to one another contains a series circuit of a p-channel field effect transistor T6 and an n-channel field effect transistor T7, whereby the gate of T6 is connected to the gate of the field effect transistor forming the load element L1. The gate of T7 is wired both to the drain terminal of T7 as well as to the gate of T5. The junction of T4 and T5 is connected to the output A of the differential amplifier, whereas the gate terminals 4 and 5 respectively represent the positive and the negative amplifier input.

The positive input 4 is wired to the positive input 6 of a level-converting circuit PU and the negative input 5 is connected to the negative input 7 thereof. The positive output 8 of the level-converting circuit PU is wired to the gate of an n-channel field effect transistor T8, whereas the negative output 9 of the level-converting circuit PU is connected to the gate of an n-channel field effect transistor T9. Field effect transistor T8 and T9 each have their source-drain paths connected parallel to the source-drain path of the field effect transistor T3.

Figure 2:
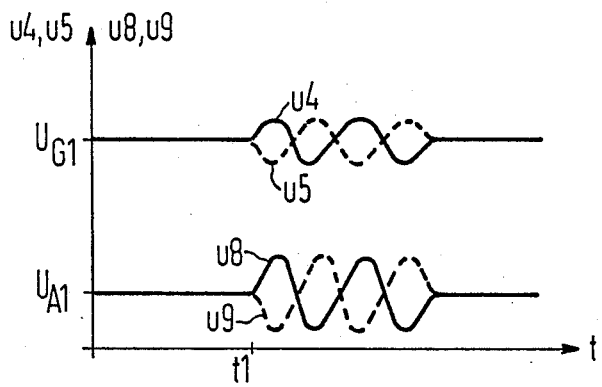
FIG. 2 is a voltage-time diagram of voltage levels in FIG. 1.

During operation, the amplifier input 4 is supplied, for example, with a sinusoidal input signal u1 which superimposes on a bias voltage $U_{G1}$, so that a resultant signal u4 derives, the time-dependency thereof being indicated in FIG. 2 with a solid line. As a result of the inverse drive with u1, a signal u5 thus lies at the input 5, this signal u5 being shown in FIG. 2 with the bias voltage $U_{G1}$ and the broken-line course of the voltage curve. Without the input signal u1, the bias voltage $U_{G1}$ is present at both inputs 4, 5. This bias voltage $U_{G1}$ is dimensioned such that T1 and T2 are transmissive. The constant current source T3 thereby supplies a quiescent current $I_O$ which is uniformly divided onto both circuit branches L1, T1 and L2 and T2 given load elements L1, L2 of identical size. $I_o/2$ then respectively flows in these. When the structural lay-outs of the transistors L2 and T4 coincide, they then form a current mirror in which that the transistor T4 is also traversed by $I_o/2$. Analogously, the current mirror composed of L1 and T6 results in that T6 and, thus, T7 also being transversed by $I_o/2$, given identical structural lay-out of these transistors. The current mirror composed of the identically structured transistors T7 and T5, finally, also results in T5 as well as T7 being traversed by $I_o/2$. Currents of identical size in the source-drain paths of T4 and T5, however, mean that no current flows via the output A into a following load circuit which is indicated with a capacitor C.

The bias voltage $U_{G1}$ also present at the inputs 6 and 7 of the level-converting circuit PU without the input signal u1 is converted into a lower output level $U_{A1}$ in the level-converting circuit PU which, for example, corresponds to the value of the threshold voltage of the n-channel field effect transistors T8 and T9 or slightly falls below this valve. It is assured in the latter case that the transistors T8 and T9 are inhibited given the lack of an output signal u1, so that the quiescent current $I_O$ is not increased.

When the input signal u1 appears at point in time T1, then the sinusoidal level control of T2 and T1 indicated in FIG. 2 derives in accordance with the voltage curves u4 and u5. As a result of the action of the level-converting circuit PU, voltages referenced u8 and u9 in FIG. 2 are obtained at the outputs 8 and 9. In detail, u8 corresponds to a bias voltage value $U_{A1}$ supplied to the gate of T8 which has the amplified input signals u1 superimposed on it in the level-converting circuit PU, whereas u9 is composed of the bias voltage value $U_{A1}$ and of an amplified and inverted input signal u1 which is superimposed thereon. Every sine half-wave of u8 exceeding $U_{A1}$ switches the transistor T8 into its transmissive condition, so that an auxiliary current $I_8$ amplifying $I_O$ flows through T8, this being divided onto the parallel circuit branches L1, T1 and L2, T2. An auxiliary current amplifying $I_O$ also appears at the appearance of every half-wave of u8 falling below the value $U_{A1}$, namely because of the half-waves of u9 chronologically coinciding with these halfwaves of u8, these half-waves of u9 in turn exceeding the bias voltage $U_{A1}$. The latter effects an activation of the transistor T9 via which an auxiliary current $I_9$ then flows. The auxiliary currents $I_8$ and $I_9$ thus effect a strong boost of the quiescent current $I_0$ during the appearance of an input signal u1. The transistors T8 and T9 represent controllable voltage sources which are connected signal-dependent in order to significantly increase the currents in the parallel circuit branches of the differential amplifier and, thus, in the output circuit A, as well as capacitor C and thus guarantees good driver qualities. When no input signal u1 is present, the quiescent current $I_O$ is so low that the power consumption of the amplifier remains extremely low.

Since the circuit PU converting the input level $U_{G1}$ to an output level $U_{A1}$ is driven from the amplifier inputs 4, 5, no prior art control circuits, as the initially cited differential amplifier, provide that the output signal appearing at A that is taken at the junctions of the transistors L1, T1 and of the transistors L2, T2 and which is transmitted to the output A via the current mirrors L2, T4 as well as L1, T6 and T7, T5 is largely distortion-free. The forwarding of the output signal to the output A thereby proceeds in detail such that, given every difference in size of the currents flowing through L2 and L1 effected due to the level control of T2 and T1 with the input signal u1, a corresponding size difference of the currents through T4 and T5 derives which leads to an output current that can be taken at A. In the differential amplifier of the present invention, the output signal responds very quickly to fluctuations of the input signal u1, so that input signals having steeply rising and falling signal edges, for example square-wave voltages, are also transmitted to the output A largely distortion-free and with a great current boost.

Figure 3:
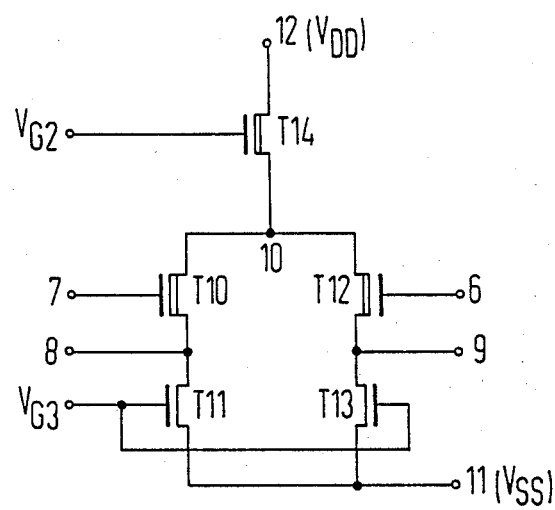
FIG. 3 is a sub-circuit diagram of FIG. 1.

FIG. 3 shows a preferred exemplary embodiment of the level-converting circuit PU. The circuit constructed as a differential amplifier stage specifically contains two parallel current branches arranged between a circuit node 10 and a terminal 11 lying at the operating potential $V_{SS}$. A first current branch has a p-channel field effect transistor T10 in series with an n-channel field effect transistor T11 and a second current branch has a p-channel field effect transistor T12 in series with an n-channel field effect transistor T13. Via a circuit branch which contains the source-drain path of a p-channel field effect transistor T14, the circuit node 10 is connected to a terminal 12 which is wired to the supply voltage $V_{DD}$. The gate of T14 lies at a prescribed gate voltage $V_{G2}$; the gates of T11 and T13 lie at a prescribed gate voltage $V_{G3}$. The inputs and outputs 6, 7, 8 and 9 of the level-converting circuit PU are provided with the same reference characters used in FIG. 1. The structural dimensions of the transistors T11 and T13 must be identical to one another and must differ from the structural dimensions of the transistor T14 to such degree that T11 and T13 work in the triode region, i.e., in the rising part of their $I_D/U_{DS}$ characteristic, whereas T14 is operated in saturation. This condition can be met in that the sum of the saturation currents of T11 and T13 is selected greater than the saturation current of T14. In an executed exemplary circuit, this condition was achieved given a supply voltage $V_{DD}$ of 10 volts, a prescribed gate voltage $V_{G2}$ of 8 volts, and a prescribed gate voltage $V_{G3}$ of 2 volts. In that the channel width/length ratios of T11 and T13 were respectively selected at 10/5 and the channel width/channel length ratio of T14 was selected at 48/5.

Figure 4:
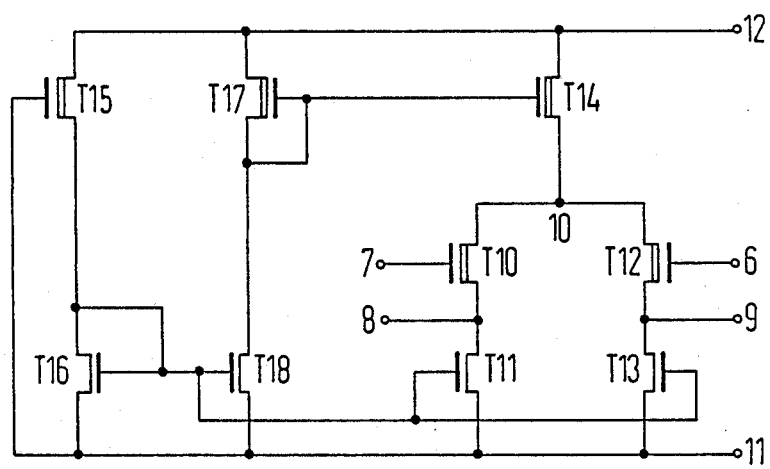
FIG. 4 is a more detailed circuit of the sub-circuit of FIG. 3.

FIG. 4 shows a development of the circuit of FIG. 3 wherein the prescribed gate voltages $V_{G2}$ and $V_{G3}$ are acquired via two current branches connecting the terminals 11 and 12 to one another. The first thereof contains the series circuit of a p-channel field effect transistor T15 and an n-channel field effect transistor T16; the second contains the series circuit of a p-channel field effect transistor T17 and an n-channel field effect transistor T18. The gate terminal of T15 is thereby connected to the terminal 11; the gate terminal of T16 is connected both to the gate terminal of T18 as well as to the drain terminal of T16; the gate terminal of T17 is connected to the drain terminal of T17. The gate voltages $V_{G2}$ for T14 and $V_{G3}$ for T11 and T13 can then be respectively taken at the gate terminals of T17 and T18. Given the expansion of the executed circuit example of FIG. 3 mentioned above by the additional current branches shown in FIG. 4, a channel width/channel length ratio of 16/5 was selected for T16 and T18, a channel width/channel length ratio of 5/15 was selected for T15 and a channel width/channel length ratio of 48/5 adapted to the transistor T14 was selected for T17.

Figure 5:
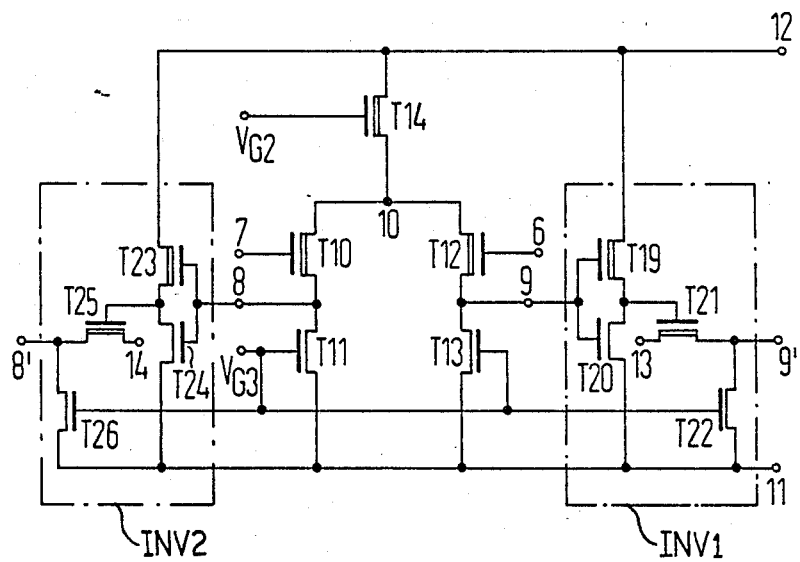
FIG. 5 is another detailed circuit of the sub-circuit of FIG. 3.

As shown in FIG. 5, the circuit of FIG. 3 can be advantageously expanded by two circuit parts INV1 and INV2. INV1 contains the series circuit of a p-channel field effect transistor T19 and an n-channel field effect transistor T20 whose gates are wired to the output 9 of the differential amplifier stage of FIG. 3. The junction of T19 and T20 is connected to the gate of a further p-channel field effect transistor T21 whose source terminal 13 is wired to the supply voltage $V_{DD}$ and whose drain terminal represents the one output 9' of the expanded circuit which replaces the output 9 of FIG. 3. The drain terminal of T21 is connected to the terminal 11 via an n-channel field effect transistor T22, whereby the gate of T22 is connected to the prescribed gate voltage $V_{G3}$. Analogously, INV2 contains the series circuit of a p-channel field effect transistor T23 and an n-channel field effect transistor T24 whose gates are wired to the output 8. The junction of T23 and T24 is wired to the gate of a p-channel field effect transistor T25 whose source terminal 14 is connected to the supply voltage $V_{DD}$ and whose drain terminal represents the output 8' of the expanded circuit which replaces the output 8 of FIG. 3. The drain terminal of T25, finally, is connected to the terminal 11 via an n-channel field effect transistor T26 whose gate is wired to $V_{G3}$.

Given the appearance of an output signal u8 which, according to FIG. 2, exceeds the value of $U_{A1}$, the inverter composed of T23 and T24 is switched from a high output level to a low output level corresponding to about $V_{SS}$. T25 is thus conductive and practically fully conducts the supply voltage adjacent at 14 to the gate of T8 via 8'. Given the appearance of an output signal u8 which falls below the value of $U_{A1}$ the signal u9 which thereby appears simultaneously likewise switches the inverter composed of T19 and T20 to a lower output level, resulting in the supply voltage present at 13 via the activated T21 being practically completely used for level control of the transistor T9 which can be reached via 9'. The level control of T8 and T9 given the same input signal u1 ensues significantly faster than in the circuit of FIG. 3 due to the function of the circuit parts INV1 and INV2.

In a departure from the embodiments of the invention set forth above, the level value $U_{A1}$ (FIG. 2) output by the level-converting circuit PU can also be selected greater or lesser than the threshold voltage of T8 and T9. In the former instance, the power consumption of the differential amplifier is somewhat increased; in the latter, it is somewhat reduced.

It also lies within the framework of the invention to interchange the two channel types of the field effect transistors employed and to simultaneously replace the polarities of the supplied voltages by the opposite polarities. The voltage values of $U_{A1}$ and $U_{G1}$ are thereby also to be interchanged with one another, that is in FIG. 2 the voltage curves u4 and u5 take the place of the voltage curves u8 and u9 and vice versa. In this case, PU converts a low input level $U_{G1}$, i.e., the d.c. component of the input signal u1 superimposed on the gate bias voltage, to a higher output level $U_{A1}$.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A differential amplifier having two parallel circuit branches lying between a first circuit node and a first supply voltage terminal, each of these parallel circuit branches containing a load element and a field effect transistor, having a further circuit branch lying between said first circuit node and a second supply voltage terminal, said further circuit branch having a constant current source whereby a quiescent current supplied by the latter is divided onto both parallel circuit branches, and having two, further field effect transistors serving as controllable current sources and connected parallel to the constant current source, these further field effect transistors supplying auxiliary currents amplifying the quiescent current, whereby gate terminals of the field effect transistors in the parallel circuit branches receive an input signal, and an output signal can be taken at the junctions between the load elements and the field effect transistors in the parallel circuit branches, comprising the field effect transistors in the parallel circuit branches and the further field effect transistors are of an n-channel type; type; and a level-converting circuit having an input side connected to gate terminals of the field effect transistors in the parallel circuit branches, said level-converting circuit converting a d.c. component of an input signal to a lower output level, an output side of said level-converting circuit wired to gate terminals of the further field effect transistors.

2. The differential amplifier according to claim 1, wherein the level-converting circuit converting the d.c. component of the input signal is composed of a differential amplifier stage which contains two current branches lying between a further circuit node and the second supply voltage terminal, each of these current branches having a series circuit of two field effect transistors of different channel types; the further circuit node connected to the first supply voltage terminal via a current source transistor of a p-channel type; gate terminals of one of the field effect transistors of the current branches corresponding to the channel type of the current source transistor and forming the circuit inputs; the junctions between the latter field effect transistors and the other two field effect transistors of the current branches representing the circuit outputs; and these other two field effect transistors operating in the triode region, whereas the current source transistor operates in the saturation region.

3. The differential amplifier according to claim 2, wherein first and second additional current branches connecting the two supply voltage terminals to one another are provided, each of these additional current branches containing a first field effect transistor corresponding to the channel type of the current source transistor in series with a second field effect transistor having the other channel type; a gate terminal of the first field effect transistor of the first additional current branch connected to the second supply voltage terminal; a gate terminal of the second field effect transistor of the first current branch wired to its drain terminal and to a gate terminal of the second field effect transistor of the second, additional current branch; a gate terminal of the first field effect transistor of the second, additional current branch wired to its drain terminal; a gate terminal of the current source transistor connected to the gate terminal of the first field effect transistor of the second, additional current branch; and the gate terminals of the other two field effect transistors of the current branches of the level-converting circuit connected to the gate terminal of the second field effect transistor of the second additional current branch.

4. The differential amplifier according to claim 2, wherein the outputs of the level-converting circuit for converting the d.c. component of the input signal are connected to the gate terminals of the further field effect transistors of the further circuit branch via two additional circuits, whereby each of the additional circuits has an inverter whose output is connected to a gate terminal of a following field effect transistor via which the supply voltage can be through connected to the gate terminals of the further field effect transistors of the further circuit branch.

5. A differential amplifier having two parallel circuit branches lying between a first circuit node and a first supply voltage terminal, each of these parallel circuit branches containing a load element and a field effect transistor, having a further circuit branch lying between said first circuit node and a second supply voltage terminal, said further circuit branch having a constant current source whereby a quiescent current supplied by the latter is divided onto both parallel circuit branches, and having two, further field effect transistors serving as controllable current sources and connected parallel to the constant current source, these further field effect transistors supplying auxiliary currents amplifying the quiescent current, whereby gate terminals of the field effect transistors in the parallel circuit branches receive an input signal, and an output signal can be taken at the junctions between the load elements and the field effect transistors in the parallel circuit branches, comprising
the field effect transistors in the parallel circuit branches and the further field effect transistors are of an n-channel type;
a level-converting circuit having first and second inputs connected to gate terminals, respectively, of the field effect transistors in the parallel circuit branches, said level-converting circuit converting a d.c. component of an input signal present at the first and second inputs to a lower output level at first and second outputs, the first and second outputs of said level-converting circuit wired to gate terminals, respectively, of the further field effect transistors, the level converting circuit converting the d.c. component of the input signal being composed of a differential amplifier stage which contains two current branches lying between a further circuit node and the second supply voltage terminal, each of these current branches having a series circuit of two field effect transistors of different channel types; the further circuit node connected to the first supply voltage terminal via a current source transistor of a p-channel type; gate terminals of one of the field effect transistors of the current branches corresponding to the channel type of the current source transistor and forming the first and second inputs; the junctions between the latter field effect transistors and the other two field effect transistors of the current branches representing the first and second outputs.

6. The differential amplifier according to claim 5, wherein first and second additional current branches connecting the two supply voltage terminals to one another are provided, each of these additional current branches containing a first field effect transistor corresponding to the channel type of the current source transistor in series with a second field effect transistor having the other channel type; a gate terminal of the first field effect transistor of the first additional current branch connected to the second supply voltage terminal; a gate terminal of the second field effect transistor of the first current branch wired to its drain terminal and to a gate terminal of the second field effect transistor of the second, additional current branch; a gate terminal of the first field effect transistor of the second, additional current branch wired to its drain terminal; a gate terminal of the current source transistor connected to the gate terminal of the first field effect transistor of the second, additional current branch; and the gate terminals of the other two field effect transistors of the current branches of the level-converting circuit connected to the gate terminal of the second field effect transistor of the second additional current branch.

7. The differential amplifier according to claim 5, wherein the first and second outputs of the level-converting circuit for converting the d.c. component of the input signal are connected to the gate terminals, respectively, of the further field effect transistors of the further circuit branch via two additional circuits, whereby each of the additional circuits has an inverter whose output is connected to a gate terminal of a following field effect transistor via which the supply voltage can be through connected to the gate terminals of the further field effect transistors of the further circuit branch.

8. A differential amplifier having two parallel circuit branches lying between a first circuit node and a first supply voltage terminal, each of these parallel circuit branches containing a load element and a field effect transistor, having a further circuit branch lying between said first circuit node and a second supply voltage terminal, said further circuit branch having a constant current source whereby a quiescent current supplied by the latter is divided onto both parallel circuit branches, and having two, further field effect transistors serving as controllable current sources and connected parallel to the constant current source, these further field effect transistors supplying auxiliary currents amplifying the quiescent current, whereby gate terminals of the field effect transistors in the parallel circuit branches receive an input signal, and an output signal can be taken at the junctions between the load elements and the field effect transistors in the parallel circuit branches, comprising the field effect transistors in the parallel circuit branches and the further field effect transistors are of a p-channel type; and a level-converting circuit having an input side connected to gate terminals of the field effect transistors in the parallel circuit branches, said level-converting circuit converting a d.c. component of an input signal to a higher output level, an output side of said level-converting circuit wired to gate terminals of the further field effect transistors.

9. The differential amplifier according to claim 8, wherein the level-converting circuit converting the d.c. component of the input signal is composed of a differential amplifier stage which contains two current branches lying between a further circuit node and the second supply voltage terminal, each of these current branches having a series circuit of two field effect transistors of different channel types; the further circuit node connected to the first supply voltage terminal via a current source transistor of an n-channel type; gate terminals of one of the field effect transistors of the current branches corresponding to the channel type of the current source transistor and forming the circuit inputs; the junctions between the latter field effect transistors and the other two field effect transistors of the current branches representing the circuit outputs; and these other two field effect transistors operating in the triode region, whereas the current source transistor operates in the saturation region.

10. The differential amplifier according to claim 9, wherein first and second additional current branches connecting the two supply voltage terminals to one another are provided, each of these additional current branches containing a first field effect transistor corresponding to the channel type of the current source transistor in series with a second field effect transistor having the other channel type; a gate terminal of the first field effect transistor of the first additional current branch connected to the second supply voltage terminal; a gate terminal of the second field effect transistor of the first current branch wired to its drain terminal and to a gate terminal of the second field effect transistor of the second, additional current branch; a gate terminal of the first field effect transistor of the second, additional current branch wired to its drain terminal; a gate terminal of the current source transistor connected to the gate terminal of the first field effect transistor of the second, additional current branch; and the gate terminals of the other two field effect transistors of the current branches of the level-converting circuit connected to the gate terminal of the second field effect transistor of the second additional current branch.

11. The differential amplifier according to claim 9, wherein the outputs of the level-converting circuit for converting the d.c. component of the input signal are connected to the gate terminals of the further field effect transistors of the further circuit branch via two additional circuits, whereby each of the additional circuits has an inverter whose output is connected to a gate terminal of a following field effect transistor via which the supply voltage can be through connected to the gate terminals of the further field effect transistors of the further circuit branch.

12. A differential amplifier having two parallel circuit branches lying between a first circuit node and a first supply voltage terminal, each of these parallel circuit branches containing a load element and a field effect transistor, having a further circuit branch lying between said first circuit node and a second supply voltage terminal, said further circuit branch having a constant current source whereby a quiescent current supplied by the latter is divided onto both parallel circuit branches, and having two, further field effect transistors serving as controllable current sources and connected parallel to the constant current source, these further field effect transistors supplying auxiliary currents amplifying the quiescent current, whereby gate terminals of the field effect transistors in the parallel circuit branches receive an input signal, and an output signal can be taken at the junctions between the load elements and the field effect transistors in the parallel circuit branches, comprising the field effect transistors in the parallel circuit branches and the further field effect transistors are of a p-channel type;

a level-converting circuit having first and second inputs connected to gate terminals, respectively, of the field effect transistors in the parallel circuit branches, and said level-converting circuit converting a d.c. component of an input signal present at the first and second inputs to a higher output level at first and second outputs, the first and second outputs of said level-converting circuit wired to gate terminals, respectively, of the further field effect transistors, the level converting circuit converting the d.c. component of the input signal being composed of a differential amplifier stage which contains two current branches lying between a further circuit node and the second supply voltage terminal, each of these current branches having a series circuit of two field effect transistors of different channel types; the further circuit node connected to the first supply voltage terminal via a current source transistor of an n-channel type; gate terminals of one of the field effect transistors of the current branches corresponding to the channel type of the current source transistor and forming the first and second inputs; the junctions between the latter field effect transistors and the other two field effect transistors of the current branches representing the first and second outputs.

13. The differential amplifier according to claim 12, wherein first and second additional current branches connecting the two supply voltage terminals to one another are provided, each of these additional current branches containing a first field effect transistor corresponding to the channel type of the current source transistor in series with a second field effect transistor having the other channel type; a gate terminal of the first field effect transistor of the first additional current branch connected to the second supply voltage terminal; a gate terminal of the second field effect transistor of the first current branch wired to its drain terminal and to a gate terminal of the second field effect transistor of the second, additional current branch; a gate terminal of the first field effect transistor of the second, additional current branch wired to its drain terminal; a gate terminal of the current source transistor connected to the gate terminal of the first field effect transistor of the second, additional current branch; and the gate terminals of the other two field effect transistors of the current branches of the level-converting circuit connected to the gate terminal of the second field effect transistor of the second additional current branch.

14. The differential amplifier according to claim 12, wherein the first and second outputs of the level-converting circuit for converting the d.c. component of the input signal are connected to the gate terminals, respectively, of the further field effect transistors of the further circuit branch via two additional circuit, whereby each of the additional circuits has an inverter whose output is connected to a gate terminal of a following field effect transistor via which the supply voltage can be through connected to the gate terminals of the further field effect transistors of the further circuit branch.

* * * * *